United States Patent [19]
Hale et al.

[11] 4,268,582
[45] May 19, 1981

[54] BORIDE COATED CEMENTED CARBIDE

[75] Inventors: Thomas E. Hale, Warren; Roy C. Lueth, Marine City, both of Mich.

[73] Assignee: General Electric Company, Detroit, Mich.

[21] Appl. No.: 16,902

[22] Filed: Mar. 2, 1979

[51] Int. Cl.³ .................. C23C 11/14; B32B 13/04; B32B 31/24

[52] U.S. Cl. ......................... 428/446; 75/202; 75/203; 75/205; 75/238; 148/31.5; 427/249; 427/419.7; 428/472; 428/627; 428/911; 428/932; 428/938; 428/698

[58] Field of Search ............... 428/446, 472, 911, 539, 428/627, 932, 938; 427/249, 419 F, 419.7; 75/202, 203, 205, 238; 148/6, 6.3, 31, 31.5

[56] References Cited

U.S. PATENT DOCUMENTS

| | | | |
|---|---|---|---|
| 2,844,492 | 7/1958 | Fitzer | 148/6.3 |
| 3,029,162 | 4/1962 | Samuel et al. | 148/6.3 |
| 3,459,515 | 8/1969 | Bergmann | 75/238 |
| 3,547,673 | 12/1970 | Bredzs et al. | 75/202 X |
| 3,640,689 | 2/1972 | Glaski et al. | 428/627 |
| 3,647,576 | 3/1972 | Yamamura et al. | 75/202 X |
| 3,656,995 | 4/1972 | Reedy | 427/248 R |
| 3,661,524 | 5/1972 | Holden et al. | 423/440 |
| 3,712,798 | 1/1973 | Thyne et al. | 428/627 |
| 3,717,496 | 2/1973 | Kieffer et al. | 428/335 |
| 3,784,402 | 1/1974 | Reedy | 428/472 X |
| 3,787,245 | 1/1974 | Kunst | 148/6 |
| 3,811,961 | 5/1974 | Weinstein et al. | 148/6 |
| 3,836,392 | 9/1974 | Lux et al. | 428/335 |
| 3,882,581 | 5/1975 | Mereness et al. | 409/119 |
| 4,018,631 | 4/1977 | Hale | 427/249 X |
| 4,035,541 | 7/1977 | Smith et al. | 428/472 X |
| 4,150,984 | 4/1979 | Tanaka et al. | 75/238 |
| 4,153,483 | 5/1979 | Holzl | 428/938 X |
| 4,162,338 | 7/1979 | Schintlmeister | 427/249 |
| 4,187,344 | 2/1980 | Fredriksson | 428/446 |
| 4,196,233 | 4/1980 | Bitzer et al. | 427/249 |

FOREIGN PATENT DOCUMENTS 1056450 4/1959 Fed. Rep. of Germany.

Primary Examiner—Harold Ansher
Attorney, Agent, or Firm—Morgan, Finnegan, Pine, Foley & Lee

[57] ABSTRACT

A coated cemented carbide article comprises a cemented carbide substrate, the surface regions thereof having diffused therein an element such as boron, silicon or aluminum. The article further comprises a coating disposed on the diffused substrate, the coating being a boride such as titanium boride, hafnium boride, zirconium boride or tantalum boride. In another embodiment the coated cemented article further includes an interlayer sandwiched between the diffused substrate and the boride coating, the interlayer being one or more layers formed from the carbides, nitrides or carbonitrides of elements from groups IVb and Vb of the Periodic Table of Elements, and combinations thereof.

23 Claims, No Drawings

BORIDE COATED CEMENTED CARBIDE

BACKGROUND OF THE INVENTION

The present invention relates to coatings on cemented carbide bodies, and particularly, to the use of boride coatings on cemented carbide substrates to obtain firm bonding and improve wear resistance.

Cemented carbides are well known for their unique combination of hardness, strength, and wear resistance, and are accordingly extensively used for such industrial applications as cutting tools, drawing dies and wear parts. For abrasive wear and nonferrous metal-cutting applications, WC-Co compositions are preferred because of their high strength and good abrasion resistance. For steel machining applications, compositions consisting of WC-TiC-TaC-Co, TiC-Ni or TiC-Ni-Mo are preferred because they are less reactive with steel workpieces at high machining speeds. The use of carbides other than WC generally results in a significant strength reduction, however, which limits either the amount of TiC and other carbides that can be added or the severity of the application when large amounts of TiC are used.

The use of carbide, nitride, and carbonitride coatings on cemented carbide is well known as a way to improve wear resistance in machining and metal turning applications. However, it has been found that such coatings do not possess the requisite hardness for purely abrasive wear situations such as are encountered in the drilling of rock and coal cutting. In addition, the carbide, nitride, and carbonitride coated articles cannot be brazed to steel holders because the liquid braze metal will not wet the carbide, nitride, and carbonitride coatings.

The use of boride coatings represents an improvement over carbide, nitride and carbonitride coatings. More particularly, boride coatings, such as $TiB_2$, are harder than carbide and nitride coatings, such as TiC and TiN, and thus, more useful in purely abrasive wear situations such as coal cutting and rock drilling. In addition, boride coatings are easily wet by braze metals, and thus, the boride coated articles can be brazed to steel holders. This greatly facilitates their use in articles such as coal cutters and roof support drilling tools which must be brazed.

THE PRIOR ART

Examples of the prior art include: U.S. Pat. No. 3,717,496 to Kieffer, issued Feb. 20, 1973 and entitled "Machine Parts Having A Wear And Abrasion Resistant Surface;" U.S. Pat. No. 2,844,492 to Fitzer, issued July 22, 1958 and entitled "Method Of Producing Heat Resisting Metallic Materials And Formed Bodies;" U.S. Pat. No. 3,029,162 to Samuel, issued Apr. 10, 1962 and entitled "Process For The Production Of Metallic Borides On The Surface Of Metals;" U.S. Pat. No. 3,661,524 to Holden, issued May 9, 1972 and entitled "Preparation Of Titanium Carbide;" U.S. Pat. No. 3,712,798 to Van Thyne, issued Jan. 23, 1973 and entitled "Chromium Boride Coated Articles;" U.S. Pat. No. 3,787,245 to Kunst, issued Jan. 22, 1974 and entitled "Method For The Boration of Titanium And Titanium Alloys;" U.S. Pat. No. 3,811,961 to Weinstein, issued May 21, 1974 and entitled "Boridized Steel-Bonded Carbides;" U.S. Pat. No. 3,836,392 to Lux et al, issued Sept. 17, 1974 and entitled "Process For Increasing The Resistance To Wear Of The Surface Of Hard Metal Cemented Carbide Parts Subject To Wear;" and U.S. Pat. No. 3,882,581 to Mereness et al, issued May 13, 1975 and entitled "Coated, Partially Laminated Carbide Cutting Tool Insert."

Briefly, the Kieffer patent discloses the coating of a metallic carbide substrate with a titanium compound to produce an abrasion resistant surface by heating the substrate in the presence of titanium tetrachloride and hydrogen peroxide. The Fitzer patent broadly discloses the chemical vapor deposition of metallic boride coatings by reaction of boron halides in a hydrogen carrier gas. The Samuel patent relates to the coating of a metal substrate with a metallic boride including titanium boride. The Holden patent relates to the formation of a titanium carbide coating by reaction with a titanium halide in a hydrogen atmosphere. The Van Thyne patent relates to the coating of a substrate with a metallic boride. The Kunst patent relates to the formation of titanium boride. The Weinstein patent relates to the treatment of cemented carbide surfaces with a boride coating. The Lux patent relates to the coating of cemented carbide substrates. The Mereness patent discloses a cemented carbide tool insert including a titanium compound coating on the carbide substrate.

It is an object of the present invention to provide a new and improved boride coated cemented carbide which exhibits a much higher degree of wear resistance than the coatings of the prior art.

It is another object of the subject invention to provide a new and improved process for forming a boride coated cemented carbide.

SUMMARY OF THE INVENTION

The present invention relates to a new and improved boride coated cemented carbide article, and a process which provides a significant and surprising increase in the abrasion resistance of known boride coated cemented carbide articles.

In the preferred embodiment of the present invention, the subject coated cemented carbide article comprises a cemented carbide substrate, the surface region of the substrate having been diffused with an element such as boron, silicon or aluminum; an interlayer disposed on the diffused substrate; and a boride coating disposed on the interlayer. In accordance with the subject invention the interlayer may comprise one or more layers each of which being selected from the group consisting of the carbides, nitrides, and carbonitrides of elements from groups IVb and Vb of the Periodic Table of Elements and combinations thereof. The boride coating disposed on the interlayer may be a boride such as titanium boride, hafnium boride, zirconium boride or tantalum boride.

In another embodiment of the present invention the subject coated cemented carbide comprises a cemented carbide substrate; an interlayer disposed on the substrate; and a boride coating disposed on the interlayer. Again, the interlayer may comprise one or more layers each of which being selected from the group consisting of the carbides, nitrides and carbonitrides, of elements from groups IVb and Vb of the Periodic Table of Elements and Combinations thereof. The boride coating disposed on the interlayer may be a boride selected from the group consisting of titanium boride, hafnium boride, zirconium boride, and tantalum boride.

In a further embodiment of the present invention, the subject coated cemented carbide comprises a cemented carbide substrate, the surface region of the substrate having been diffused with an element such as boron, silicon or aluminum; and a boride coating disposed on the diffused substrate, the boride coating being selected from the group consisting of titanium boride, hafnium boride, zirconium boride and tantalum boride.

DETAILED DESCRIPTION OF THE PREFERRED EMBODIMENTS

The present invention relates to new and improved boride coated cemented carbide articles which may be formed into tools typically used in machining applications, rock drilling, coal cutting, etc. The invention also relates to a process which provides a significant and very surprising increase in the abrasion resistance of such boride coated cemented carbide articles. The term "cemented carbide" as used herein means one or more transitional carbides of a metal of Groups IVb and Vb and VIb of the Periodic Table of the Elements, cemented or bonded by one or more matrix metals selected from the Group Fe, Ni and Co. A typical cemented carbide may contain WC in a cobalt matrix or TiC in a nickel matrix.

One of the problems faced in abrasive wear situations such as coal cutting and rock drilling is to provide a hard coating which is firmly bonded to a cemented carbide substrate and yet is brazeable to steel holders. Boride coatings such as titanium boride ($TiB_2$) are harder than carbide and nitride coatings such as TiC and TiN and thus the boride coatings has greater potential in purely abrasive wear applications. It is an important requirement that the boride coatings be firmly bonded to the cemented carbide substrate in order to prevent loss of the coating of spalling. The process disclosed herein achieves such firm bonding for abrasive wear situations, and in addition, has a very surprising effect upon the abrasion resistance of a cutting tool formed from the treated carbide.

Turning first to the most preferred embodiment of the present invention, the subject cemented carbide article comprises a cemented carbide substrate, the surface region thereof having been diffused with an element such as boron, silicon or aluminum; an interlayer disposed on the diffused substrate; and a boride coating disposed on the interlayer. In accordance with the subject invention the diffusion depth may range from about 1 micron to several hundred microns, such as for example up to 200 microns. Preferably, however, the diffusion depth ranges from about 5 to 20 microns, with the optimum depth being about 15 microns. It has been found that where the diffusion depth is in a range less than about 5 to 10 microns the wear resistance improvement of the article is decreased, while in a range greater than about 20-30 microns the toughness of the coated article decreases with little additional improvement in the wear resistance.

The interlayer of the subject boride coated cemented carbide article may be one or more layers each of which being selected from the group consisting of the carbides, nitrides, and carbonitrides, of elements from groups IVb and Vb of the Periodic Table of Elements, and combinations thereof. The thickness of the interlayers can vary from as low as a monoatomic layer to several microns. The lower limit of interlayer thickness is determined by the need to completely cover the substrate. The upper limit of interlayer thickness is determined by the fact that as the thickness of the interlayer increases a proportional loss of strength and toughness is encountered. Accordingly, the upper limit of interlayer thickness for practical purposes is about 10 microns. The preferred interlayer thickness range is about 0.2 to 2.0 microns.

The boride coating disposed on the interlayer may be a boride such as titanium boride, hafnium boride, zirconium boride or tantalum boride. The thickness of the boride coating can broadly range from about 1 to 20 microns. However, the wear resistance improvement begins to decline where the boride coating thickness is less than about 5 microns, and toughness is reduced where the boride coating thickness is more than about 20 microns. In addition, there is little additional increase in wear resistance when the boride coating has a thickness greater than about 20 microns. Thus, for practical purposes, it is preferable that the boride coating have a thickness in the range of from about 5 microns to 20 microns, and most preferably about 10 microns.

In order to more particularly point out the above-described preferred embodiment of the subject invention reference is made to the following Example.

EXAMPLE 1

A cemented carbide* rock drilling compact having 5/16inch diameter hemispherical dome engagement surfaces was treated as follows:

(a) Heated to about 950° C. and held for about ten minutes in flowing $H_2$;

(b) Exposed for about five minutes to $H_2$-1.5 volume % $BCl_3$ to deposit boron;

(c) Held for about twenty minutes at about 950° C. in flowing $H_2$ to diffuse the boron for depth of about 15 microns into the surface regions of the cemented carbide;

(d) Held for about twenty minutes at about 1050° C. in a flowing gas mixture of $H_2$-5 volume % $CH_4$-2 volume % $TiCl_4$ to deposit a layer of TiC about 1½ microns thick onto the boron diffused cemented carbide;

(e) Held for about fifteen minutes at about 1050° C. in a flowing gas mixture of $H_2$-33 volume % $N_2$-2 volume % $TiCl_4$ to deposit a layer of TiN about 1½ microns thick overlying the layer of TiC;

(f) Held for about ninety minutes at approximately 800° C. in a flowing gas mixture of $H_2$-3.3 volume % $BCl_3$-2 volume % $TiCl_4$ to deposit $TiB_2$ coating about 10 microns thick. The above steps were conducted at a pressure of one atmosphere.

*Chemical Composition (by wt.)

| | |
|---|---|
| tungsten carbide, WC | 84.0% |
| cobalt, Co. | 16.0% |
| Hardness (Rockwell A) | 86.0–87.5 |
| Density | 13.9gm/cm$^3$ |
| Transverse Rupture Strength | 420,000 psi |
| Ultimate Compressive Strength | 560,000 psi |
| Ultimate Tensile Strength | 270,000 psi |
| Modulus of Elasticity | 76 million psi |
| Proportional Limit | 100,000 psi |
| Ductility (% elongation) | 0.4% |
| Impact Strength (Charpy) | 25 in-lb |
| Abrasion Resistance $\frac{1}{(\text{vol. loss (cc)})}$ | 3 |
| Electrical Conductivity (%copper @ 25° C.) | 9.2% |
| Electrical Resistivity | 19.0 Microhm-cm |

THERMAL CONDUCTIVITY

| TEMPERATURE °C. | Cal / (Sec.) (°C.) (cm) |
|---|---|
| 50 | 0.21 |
| 100 | 0.19 |
| 150 | 0.19 |
| 200 | 0.19 |
| 250 | 0.19 |

-continued

| | |
|---|---|
| 300 | 0.19 |
| 400 | 0.19 |
| 500 | 0.19 |

| COEFFICIENT OF THERMAL EXPANSION | |
|---|---|
| From Room Temp. to °F. | Expansion per °F. $\times 10^{-6}$ |
| 400 | 3.2 |
| 750 | 3.3 |
| 1100 | 3.5 |
| 1500 | 3.8 |
| 1800 | 3.9 |

The compact thus prepared (X), along with an uncoated control compact, were used to machine a block of sandstone rock 15 inches long by 4 inches wide using a shaper machine. The cutting conditions were a speed of 1200 inches per minute, a feed rate of 0.020 inches per pass, and depth of cut of 0.080 inches. Four cuts across the rock were made. The results are shown in the following table.

TABLE 1

| | Weight Loss(gms) | Improvement Ratio |
|---|---|---|
| Uncoated Control | .2960 | — |
| X | .0069 | 43 |

Several other compacts were given treatments similar to that set forth in Example 1 in order to determine acceptable ranges of the various conditions applied. Accordingly, it has been found that generally, the boron may be diffused into the substrate by passing a mixture of hydrogen and about 0.1 to 5.0 volume percent of boron trichloride gas over the substrate for about 5 to 60 minutes at about 600° C. to 1200° C. The temperature ranges for the deposition of the subject interlayers, (TiC and TiN in Example 1) are 700° to 1300° C. with the preferred range being 900° to 1100° C. The accepted range of pressures for the subject process is from about 5 torr. to one atmosphere of pressure. The range of $TiCl_4$ content in steps (d), (e) and (f) is from about ½ volume % to 20 volume %. The range of $CH_4$ content in step (d) is 0 to about 20 volume %. The range of $N_2$ content in step (e) is from about 1 volume % to 95 volume %. In addition to the above mentioned range of $TiCl_4$ content in step (f) the other conditions in step (f) are a treatment time in the range of a few minutes to several hours, a temperature range of from 600° to 1200° C., and a $BCl_3$ content in the range of about 1 to 5 volume %.

In another embodiment of the present invention the subject coated cemented carbide article comprises a coated cemented carbide substrate, the surface regions of the substrate having diffused therein an element such as boron, silicon or aluminum; and a coating disposed on the diffused substrate, the coating being a boride such as titanium boride, hafnium boride, zirconium boride or tantalum boride. The diffusion depth may range from about 1 micron to several hundred microns, such as for example, 200 microns. Preferably, however, the diffusion depth ranges from about 5 to 20 microns, with the optimum depth being about 15 microns. The thickness of the boride coating can broadly range from about 1 to 20 microns. However, as indicated above relative to the first embodiment of the present invention, for practical purposes it is preferable that the boride coating have a thickness in the range of from about 5 to 20 microns, and most preferably about 10 microns.

In order to more particularly point out this embodiment of the present invention, reference is made to the following Example.

EXAMPLE 2

Cemented carbide rock drilling compacts, the same as in Example 1 above, were treated in the following manner:

(a) Heated to about 900° C. and held for about fifteen minutes in flowing $H_2$;

(b) Held for about five minutes at 900° C. in a flowing gas mixture of $H_2$-7.9 volume % $BCl_3$ to deposit boron (c) Held for about twenty minutes at about 900° C. in flowing $H_2$ to diffuse boron into the surface region of the cemented carbide substrate;

(d) Held for about one hundred fifty minutes at about 800° C. in a flowing gas mixture of $H_2$-7.1 volume % $BCl_3$-2 volume % $TiCl_4$ to deposit a $TiB_2$ coating onto the boron diffused substrate.

Compacts coated in this manner had $TiB_2$ coatings ranging in thickness from about 5 to 10 microns, and boron diffused into the surface of the substrate to depths of from 5 to 20 microns. When used to machine sandstone in the manner described in Example 1 the treated compacts exhibited on improvement in wear resistance over untreated, uncoated compacts in a range of about 5 to 50 times. It will be noted that for comparison purposes, when rock drilling compacts as in Example 1 were coated with $TiB_2$ but without the interlayers and diffusion of boron into the surface region of the cemented carbide substrate as provided in Example 1, the wear resistance obtained in the rock cutting test (the same as in Example 1) was only a factor of 2 or 3 times better than the uncoated, untreated compact. Additionally, when boron was diffused into the cemented carbide substrate, but no coatings was deposited, the wear resistance improvement was only a factor of about 2 to 3 over the untreated, uncoated compact. It will be further noted that additional tests were conducted to determine acceptable ranges for the various conditions in the subject process. Specifically, it was found that generally, the boron may be diffused into the substrate by passing a mixture of hydrogen and about 0.1 to 5.0 volume % of boron trichloride gas over the substrate for about 5 to 60 minutes at about 600° C. to 1200° C. The accepted range of pressures for the subject process is from about 5 torr. to one atmosphere of pressure. The range of conditions in step (f) are a treatment in time in the range of a few minutes to several hours; a temperature range of from 600° to 1200° C.; a $TiCL_4$ (step d) content of from about ½ volume % to about 20 volume %; and a $BCl_3$ content in the range of about 1 to 5 volume % (steps b and d).

The additional tests indicated that when the element diffused into the surface region of the cemented carbide substrate was boron, and the cemented carbide was one having a cobalt matrix, where the cobalt content was relatively low, i.e. on the order of 3 to 10 weight %, it was necessary to include a carbide, nitride or carbonitride interlayer between the boron diffused substrate and the titanium boride coating in order to obtain the preferred adhesion of the titanium boride coating to the substrate. At higher cobalt levels, however, i.e. on the order of 15 to 20 weight percent, it was found that the interlayer was not necessary.

In a further embodiment of the present invention, the subject coated cemented carbide article comprises, a cemented carbide substrate; an interlayer disposed on the substrate; and a boride coating disposed on the interlayer. In accordance with the subject invention, the interlayer may comprise one or more layers each of which being selected from the group consisting of the carbides, nitrides, and carbonitrides of elements from groups IVb and Vb of the Periodic Table of Elements, and combinations thereof. As in the above described first embodiment of the present invention the thickness of the interlayer can vary from as low as a monoatomic layer to several microns, with the upper limit for practical purposes being about 10 microns and the preferred range being about 0.2 to 2.0 microns.

The boride coating disposed on the interlayer may be a boride such as titanium boride, hafnium boride, zirconium boride or tantalum boride. The thickness of the boride coating can broadly range from about 1 to 20 microns. However, the wear resistance improvement begins to decline where the boride coating thickness is less than about 5 microns, and toughness is reduced where the boride coating thickness is more than about 20 microns. In addition, there is little additional increase in wear resistance when the boride coating has a thickness greater than about 20 microns. Thus, for practical purposes, it is preferable that the boride coating have a thickness in the range of from about 5 microns to 20 microns, and most preferably about 10 microns.

In order to more particularly point out the above-described preferred embodiment of the subject invention, reference is made to the following Example.

EXAMPLE 3

Several cemented carbide* cutting inserts were treated in the following manner:

(a) The inserts were heated to about 1050° C. and held for about fifteen minutes in an atmosphere of flowing hydrogen.

(b) They were then treated for about ten minutes at about 1050° C. at a pressure of one atmosphere in an atmosphere of $H_2$, 2.5 volume % $TiCl_4$ to form a thin (<1 micron) adherent layer of TiC.

(c) They were then heated at about 800° C., at a pressure of one atmosphere for periods ranging from thirty minutes to ninety minutes in an atmosphere of $H_2$-2.5 volume % $TiCl_4$-3 volume % $BCl_3$ to obtain $TiB_2$ coatings ranging in thickness from about 2.3 to 7.5 microns.

| *Chemical Composition (by wt.) | |
|---|---|
| tungsten carbide, WC | 94.0% |
| cobalt, Co | 6.0% |
| Hardness (Rockwell A) | 91.7-92.2 |
| Density | 15.0 gm/cm$^3$ |
| Transverse Rupture Strength | 290,000 psi |
| Ultimate Compressive Strength | 790,000 psi |
| Ultimate Tensile Strength | 210,000 psi |
| Modulus of Elasticity | 94 million psi |
| Proportional Limit | 280,000 psi |
| Ducility (% elongation) | 0.2% |
| Impact Strength (Charpy) | 12 in-lb |
| Abrasion Resistance $\frac{1}{(vol.\ loss\ [cc])}$ | 35 |
| Electrical Conductivity (% copper @ 25° C.) | 10.2% |
| Electrical Resistivity | 17.0 Microhm-cm |

| THERMAL CONDUCTIVITY | |
|---|---|
| TEMPERATURE °C. | Cal (Sec.)(°C.)(cm) |
| 50 | 0.24 |
| 100 | 0.24 |
| 150 | 0.24 |
| 200 | 0.24 |

| -continued | |
|---|---|
| COEFFICIENT OF THERMAL EXPANSION | |
| From Room Temp. to °F. | Expansion per °F. $\times 10^{-6}$ |
| 400 | 2.5 |
| 750 | 2.7 |
| 1100 | 2.8 |
| 1500 | 3.0 |
| 1800 | 3.0 |

These treated inserts were then used to machine a block of sandstone rock 15 inches long by 4 inches wide using a shaper machine. The cutting conditions were 1200 inches per minute speed, 0.050 inches per pass feed, and 0.040 inch depth of cut. Eight cuts across the face of the sandstone block were made and the weight loss of the cutting insert due to wear was measured as an indication of wear resistance. An uncoated insert of the same cemented carbide composition without an interlayer was subjected to the same test for comparison purposes. The following table shows the results obtained.

TABLE 2

| Run # | TiB$_2$ Coating Thickness (microns) | Wt. Loss (gms) | Improvement Ratio |
|---|---|---|---|
| Control | 0 | .0145 | — |
| A | 4.5 (30 min. coating time) | .0038 | 3.8 |
| B | 2.3 | .0035 | 4.1 |
| C | 7.5 (90 min. coating time) | .0022 | 6.6 |

Additional tests were conducted to determine an acceptable range of conditions for the subject process. Accordingly, it was found that the range of temperatures for step (b) is about 700° to 1300° C., and preferably about 900° to 1100° C. The acceptable range of pressures for steps (b) and (c) are from about 5 torr. to one atmosphere. The $TiCl_4$ content in steps (b) and (c) is from about ½ volume % to about 20 volume %.

In summary, the present invention provides new and improved coated cemented carbide articles which provide significant and very surprising increases in the wear resistance of the articles.

Briefly, the present invention discloses three preferred embodiments of coated cemented carbide articles. In one embodiment the article comprises a cemented carbide substrate, the surface regions of which having boron diffused therein; and a boride coating disposed on the substrate. In another embodiment the subject article further includes an interlayer sandwiched between the boron diffused substrate and the boride coating, the interlayer comprising one or more layers including the carbides, nitrides and carbonitrides of elements of groups IVb and Vb of the Periodic Table of Elements and combinations thereof. In a further embodiment, the subject article includes a cemented carbide substrate; an interlayer as described above, disposed on the substrate; and a boride coating adhered to the interlayer. The preferred process for treatment of cemented carbides in accordance with the present invention is chemical vapor deposition. However, other processes such as physical vapor deposition, pack diffusion and coating, molten salt bath deposition, etc..., may also be employed.

Whereas cemented carbide articles having boron diffused into the substrate alone without a boride coating, or articles having a boride coating on the substrate without any boron diffusion into the substrate, exhibited in the above described tests a wear resistance 2 to 3 times greater than untreated, uncoated articles, the cemented carbide articles of the present invention exhibited a very surprising increase in wear resistance over untreated, uncoated articles, the improvement exhibited in said tests being on the order of 20 to 50 times.

While there have been described herein what are at present considered preferred embodiments of the invention, it will be obvious to those skilled in the art that many modifications and changes may be made therein without departing from the essence of the invention. It is therefore to be understood that the exemplary embodiments are illustrative and not restrictive of the invention, the scope of which is defined in the appended claims, and that all modifications that come within the meaning and range of equivalency of the claims are intended to be included therein.

What is claimed is:

1. A coated cemented carbide article comprising: a cemented carbide substrate, the surface region of said substrate having diffused therein for predetermined a depth an element selected from the group consisting of boron, silicon, and aluminum; and a coating disposed on said diffused substrate surface said coating being a boride selected from the group consisting of titanium boride, hafnium boride, zirconium boride, and tantalum boride.

2. A coated cemented carbide article as recited in claim 1 in which the element diffused into the surface region of the cemented carbide substrate is boron.

3. A coated cemented carbide article as recited in claim 1 in which the element diffused into the surface region of the cemented carbide substrate is silicon.

4. A coated cemented carbide article as recited in claim 1 in which the element diffused into the surface region of the cemented carbide substrate is aluminum.

5. A coated cemented carbide article as recited in claim 1 wherein said cemented carbide substrate has a cobalt content greater than 10% by weight.

6. A coated cemented carbide article as recited in claim 5 in which said boride coating is titanium boride.

7. A coated cemented carbide article as recited in claim 5 in which said boride coating is hafnium boride.

8. A coated cemented carbide article as recited in claim 5 in which said boride coating is zirconium boride.

9. A coated cemented carbide article as recited in claim 5 in which said boride coating is tantalum boride.

10. A coated cemented carbide article having a cobalt content greater than 10% by weight comprising:
a cemented carbide substrate, the surface region of said substrate having diffused therein boron for a predetermined depth; and a titanium boride coating disposed on said boron diffused substrate.

11. A coated cemented carbide article comprising:
a cemented carbide substrate;
an interlayer disposed on said substrate, said interlayer including at least one layer selected from the group consisting of the carbides, nitrides and carbonitrides of elements from groups IVb and Vb of the Periodic Table of Elements, and combinations of said carbides, nitrides and carbonitrides of elements from groups IVb and Vb of the Periodic Table of Elements; and
a coating disposed on said interlayer said coating being a boride selected from the group consisting of titanium boride, hafnium boride, zirconium boride and tantalum boride.

12. A coated cemented carbide article as recited in claim 11 in which the coating is titanium boride.

13. A coated cemented carbide article as recited in claim 11 in which the coating is hafnium boride.

14. A coated cemented carbide article as recited in claim 11 in which the coating is zirconium boride.

15. A coated cemented carbide article as recited in claim 11 in which the coating is tantalum boride.

16. A coated cemented carbide article as recited in claim 11 in which the surface region of the substrate, upon which is disposed said interlayer, is diffused with an element selected from the group consisting of boron, silicon and aluminum.

17. A coated cemented carbide article as recited in claim 16 in which the element diffused into said surface region of the substrate is boron.

18. A coated cemented carbide article as recited in claim 16 in which the element diffused into said surface region of the substrate is silicon.

19. A coated cemented carbide article as recited in claim 16 in which the element diffused into said surface region of the substrate is aluminum.

20. A coated cemented carbide article comprising:
a cemented carbide substrate, the surface region of said substrate having diffused therein an element selected from group consisting of boron, silicon and aluminum;
an interlayer disposed on said diffused surface region of the substrate, said interlayer including at least one layer selected from the group consisting of the carbides, nitrides, carbonitrides of elements from groups IVb and Vb of the Periodic Table of Elements, and combinations of said carbides, nitrides and carbonitrides of elements from groups IVb and Vb of the Periodic Table of Elements; and
a coating disposed on said interlayer, said coating being a boride selected from the group consisting of titanium boride, hafnium boride, zirconium boride and tantalum boride.

21. A coated cemented carbide article comprising:
a cemented carbide substrate, the surface region of said substrate having boron diffused therein a predetermined depth;
an interlayer disposed on said boron diffused substrate, said interlayer including at least one layer selected from the group consisting of the carbides, nitrides and carbonitrides of elements from groups IVb and Vb of the Periodic Table of Elements, and combinations of said carbides, nitrides and carbonitrides of elements from groups IVb and Vb of the Periodic Table of Elements; and
a titanium boride coating disposed on said interlayer.

22. A coated cemented carbide article as recited in claim 21 in which said interlayer comprises a first layer of titanium carbide disposed on said boron diffused surface region of said substrate and a second layer of titanium nitride overlying said first layer of titanium carbide.

23. A coated cemented carbide article as recited in claim 21 in which said interlayer comprises a first layer of titanium carbide disposed on said boron diffused surface region of said substrate; and a second layer overlying said first layer of titanium carbide said second layer being a mixture of titanium carbide and titanium nitride.

* * * * *

UNITED STATES PATENT AND TRADEMARK OFFICE
CERTIFICATE OF CORRECTION

PATENT NO. : 4,268,582
DATED : May 19, 1981
INVENTOR(S) : Thomas E. Hale and Roy C. Leuth It is certified that error appears in the above—identified patent and that said Letters Patent is hereby corrected as shown below:

At column 9, line 23, after "for" delete "predetermined a" and insert -- a predetermined -- .

Signed and Sealed this

Twentieth Day of July 1982

[SEAL]

Attest:

GERALD J. MOSSINGHOFF

Attesting Officer     Commissioner of Patents and Trademarks